(12) United States Patent
Ui et al.

(10) Patent No.: US 10,388,544 B2
(45) Date of Patent: Aug. 20, 2019

(54) SUBSTRATE PROCESSING APPARATUS AND SUBSTRATE PROCESSING METHOD

(71) Applicants: KABUSHIKI KAISHA TOSHIBA, Tokyo (JP); TOKYO ELECTRON LIMITED, Tokyo (JP)

(72) Inventors: Akio Ui, Tokyo (JP); Hisataka Hayashi, Kanagawa-ken (JP); Takeshi Kaminatsui, Kanagawa-ken (JP); Shinji Himori, Yamanashi-ken (JP); Norikazu Yamada, Yamanashi-ken (JP); Takeshi Ohse, Yamanashi-ken (JP); Jun Abe, Yamanashi-ken (JP)

(73) Assignees: Kabushiki Kaisha Toshiba, Tokyo (JP); Tokyo Electron Limited, Tokyo (JP)

( * ) Notice: Subject to any disclaimer, the term of this patent is extended or adjusted under 35 U.S.C. 154(b) by 732 days.

(21) Appl. No.: 14/626,277

(22) Filed: Feb. 19, 2015

(65) Prior Publication Data
US 2015/0162223 A1 Jun. 11, 2015

Related U.S. Application Data

(62) Division of application No. 12/562,137, filed on Sep. 18, 2009, now abandoned.

(30) Foreign Application Priority Data

Sep. 24, 2008 (JP) .................................. 2008-244260
Mar. 25, 2009 (JP) .................................. 2009-75135

(51) Int. Cl.
*H01L 21/67* (2006.01)
*H01J 37/32* (2006.01)
(Continued)

(52) U.S. Cl.
CPC ...... *H01L 21/67069* (2013.01); *H01J 37/321* (2013.01); *H01J 37/32009* (2013.01);
(Continued)

(58) Field of Classification Search
CPC ......... H01L 21/67069; H01L 21/32136; H01L 21/3065; H01L 21/31116; H01L 21/31138;
(Continued)

(56) References Cited

U.S. PATENT DOCUMENTS 4,950,376 A 8/1990 Hayashi et al.
5,562,952 A * 10/1996 Nakahigashi ......... C23C 16/405
118/50

(Continued)

FOREIGN PATENT DOCUMENTS

CN 101137269 A 3/2008
JP 9-129621 5/1997
(Continued)

OTHER PUBLICATIONS

Wang et al., "Control of Ion Energy Distribution at Substrates During Plasma Processing," Journal of Applied Physics, vol. 88, No. 2, pp. 643-646, (2000).
(Continued)

*Primary Examiner* — Rakesh K Dhingra
(74) *Attorney, Agent, or Firm* — Finnegan, Henderson, Farabow, Garrett & Dunner, L.L.P.

(57) ABSTRACT

There are provided a substrate processing apparatus and a substrate processing method realizing an effective reduction of a voltage change of a substrate on an electrode to reduce the variation of incident energy of ions entering the substrate. The substrate processing apparatus includes: a first electrode holding a substrate on a main surface of the first electrode; a second electrode facing the first electrode; a RF
(Continued)

power source applying to the first electrode a RF voltage whose frequency is equal to or higher than 40 MHz; and a pulse voltage applying unit applying to the first electrode a pulse voltage decreasing in accordance with a lapse of time, by superimposing the pulse voltage on the RF voltage.

4 Claims, 13 Drawing Sheets

(51) Int. Cl.
    *H01L 21/3065*     (2006.01)
    *H01L 21/311*     (2006.01)
    *H01L 21/3213*     (2006.01)
    *H01L 21/66*     (2006.01)

(52) U.S. Cl.
    CPC .. *H01J 37/32027* (2013.01); *H01J 37/32045* (2013.01); *H01J 37/32091* (2013.01); *H01J 37/32137* (2013.01); *H01J 37/32532* (2013.01); *H01L 21/3065* (2013.01); *H01L 21/31116* (2013.01); *H01L 21/31138* (2013.01); *H01L 21/32136* (2013.01); *H01L 21/67253* (2013.01); *H01L 22/14* (2013.01); *H01L 22/26* (2013.01); *H01J 2237/3341* (2013.01)

(58) Field of Classification Search
    CPC ... H01L 21/67253; H01L 22/26; H01L 22/14; H01L 122/67253; H01J 37/32137; H01J 37/32532; H01J 37/321; H01J 37/32009; H01J 37/32091; H01J 37/32045; H01J 37/32027; H01J 2237/3341; H01J 37/3065
    USPC ....... 118/723 E, 723 ER; 156/345.43–345.47
    See application file for complete search history.

(56) References Cited

U.S. PATENT DOCUMENTS

| | | | | |
|---|---|---|---|---|
| 5,928,528 | A | * 7/1999 | Kubota | H01J 37/32706 118/708 |
| 7,811,941 | B1 | * 10/2010 | Becker | H01J 37/321 216/67 |
| 2003/0153195 | A1 | * 8/2003 | Weikmann | H01J 37/321 438/714 |
| 2003/0155075 | A1 | 8/2003 | Yasui et al. | |
| 2003/0174526 | A1 | 9/2003 | Mark | |
| 2004/0173571 | A1 | * 9/2004 | Laermer | H01J 37/32137 216/67 |
| 2004/0219797 | A1 | 11/2004 | Honda et al. | |
| 2004/0259367 | A1 | * 12/2004 | Constantine | C23F 4/00 438/695 |
| 2007/0193975 | A1 | 8/2007 | Wilson | |
| 2008/0053818 | A1 | 3/2008 | Ui | |
| 2008/0057222 | A1 | * 3/2008 | Ui | C23C 16/515 427/570 |
| 2008/0237185 | A1 | 10/2008 | Ui et al. | |
| 2009/0078678 | A1 | 3/2009 | Kojima et al. | |
| 2009/0194508 | A1 | 8/2009 | Ui et al. | |
| 2010/0315064 | A1 | * 12/2010 | Kuthi | H01J 37/321 324/111 |

FOREIGN PATENT DOCUMENTS

| | | | |
|---|---|---|---|
| JP | 2006-148156 | * | 6/2006 |
| JP | 2008-85288 | | 4/2008 |

OTHER PUBLICATIONS

Chen et al., "Fluid Modeling of Electron Heating in Low-Pressure, High-Frequency Capacitively Coupled Plasma Discharges." Journal of Applied Physics, vol. 96, No. 11, pp. 6073-6081, (2004).
Notice of Reasons for Rejection for Application No. JP2009-075135, from the Japanese Patent Office, dated Oct. 29, 2012.

* cited by examiner

SUBSTRATE PROCESSING APPARATUS AND SUBSTRATE PROCESSING METHOD

CROSS-REFERENCE TO RELATED APPLICATIONS

This application is a divisional of application Ser. No. 12/562,137, filed Sep. 18, 2009, which is based upon and claims the benefit of priority from the prior Japanese Patent Applications No. 2008-244260, filed on Sep. 24, 2008 and No. 2009-75135, filed on Mar. 25, 2009. The entire contents of which of all of the foregoing applications are incorporated herein by reference.

BACKGROUND OF THE INVENTION

1. Field of the Invention

The present invention relates to a parallel-plate type substrate processing apparatus using plasma and a substrate processing method.

2. Description of the Related Art

A parallel-plate type substrate processing apparatus includes an upper electrode and a lower electrode disposed in parallel with each other, and generates plasma by applying RF (radio frequency voltage) to the upper electrode or the lower electrode to process a substrate (wafer) placed on the lower electrode by the plasma.

There has been proposed a method to control plasma density and energy of ions entering the substrate from the plasma, by applying RF (radio frequency voltage) and a pulse negative voltage in a superimposed manner to the lower electrode. In this method, the RF controls the plasma density and the pulse negative voltage controls the energy of the ions (see JP-A 2008-85288 (KOKAI)).

However, the recent trend toward a larger diameter of a substrate and a higher density of plasma has led to an increase in the number of ions entering the substrate per unit time. The ions are positively charged, so that the negative voltage applied to the lower electrode is cancelled. This causes a change in the voltage of the substrate held on the lower electrode, leading to a large variation of incident energy of the ions entering the substrate.

BRIEF SUMMARY OF THE INVENTION

It is an object of the present invention to provide a substrate processing apparatus and a substrate processing method realizing an effective reduction in a voltage change of a substrate on an electrode to reduce the variation of incident energy of ions entering the substrate.

A substrate processing apparatus according to one aspect of the present invention includes: a chamber; a first electrode disposed in the chamber and holding a substrate on a main surface of the first electrode; a second electrode disposed in the chamber to face the first electrode; a RF power source applying to the first electrode a RF voltage whose frequency is equal to or higher than 40 MHz; and a pulse voltage applying unit applying to the first electrode a pulse voltage decreasing in accordance with a lapse of time, by superimposing the pulse voltage on the RF voltage.

A substrate processing method according to another aspect of the present invention includes: holding a substrate to be processed on an electrode disposed in a chamber; applying to the electrode a RF voltage whose frequency is equal to or higher than 40 MHz; and applying to the electrode a pulse voltage decreasing in accordance with a lapse of time, by superimposing the pulse voltage on the RF voltage.

DETAILED DESCRIPTION OF THE INVENTION (Structure of Substrate Processing Apparatus)

Figure 1:
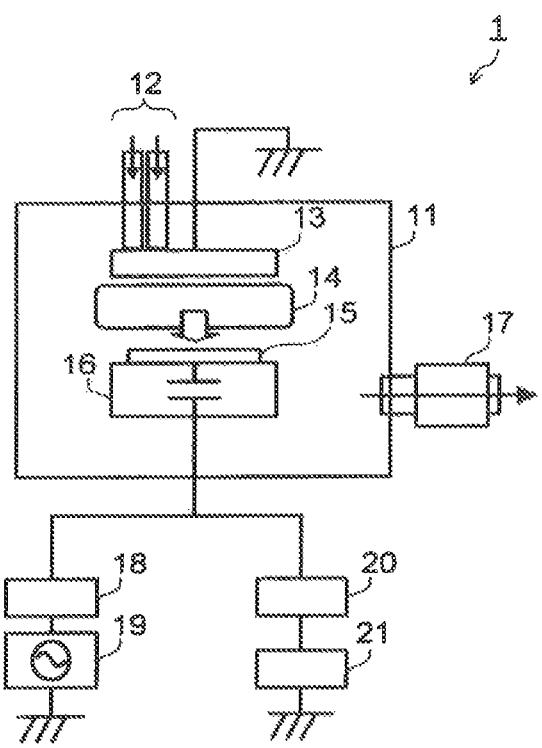
FIG. 1 is a schematic block diagram of a conventional substrate processing apparatus.
Figure 2:
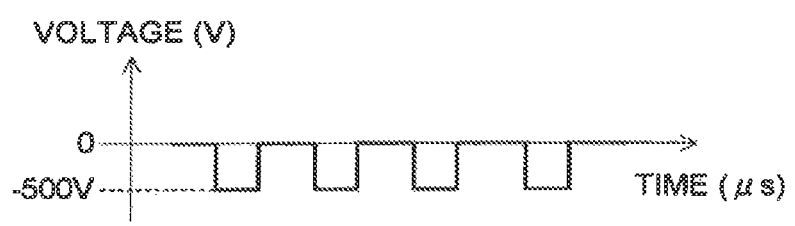
FIG. 2 is a schematic waveform chart of a voltage applied in a superimposed manner to a lower electrode.

FIG. 1 is a schematic block diagram of a conventional substrate processing apparatus 1. FIG. 2 is a schematic waveform chart of a voltage applied in a superimposed manner to a lower electrode 16. In FIG. 2, the vertical axis represents voltage (Voltage) and the horizontal axis represents time (s). Here, a parallel-plate type RIE (Reactive Ion Etching) apparatus will be described as the conventional substrate processing apparatus.

A wafer 15 is an object to be processed of the substrate processing apparatus 1 according to this embodiment. In an etching chamber 11, an environment necessary for the processing of the wafer 15 is kept. A process gas introduction pipe 12 introduces process gas necessary for the processing of the wafer 15.

The lower electrode 16 includes an electrostatic chuck for holding the wafer 15. An upper electrode 13 is disposed to face an upper side of the lower electrode 16, with its one end being grounded. The upper electrode 13 and the lower electrode 16 constitute a parallel-plate electrode.

Plasma 14 is generated by RF applied to the lower electrode 16. Ions forming the plasma 14 enter in the arrow direction in FIG. 1, that is, enters the wafer 15. The substrate processing apparatus 1 applies an etching process to the wafer 15 by utilizing the plasma 14.

An exhaust port 17 is connected to a pressure regulating valve and an exhaust pump which are not shown. Gas in the etching chamber 11 is discharged from the exhaust port 17, so that a pressure in the etching chamber 11 is kept constant. A RF power source 19 generates the RF which is to be applied to the lower electrode 16. A matching device 18 makes impedances of the RF power source 19 and the plasma 14 match with each other. A HPF (High Pass Filter) may be arranged in series in or on the subsequent stage of the matching device 18 to prevent pulse components from inputting to the RF power source 19.

A DC pulse power source 21 inputs a voltage (DC pulse) with a waveform shown in FIG. 2 to a LPF (Low Pass Filter) 20. As shown in FIG. 2, in the conventional substrate processing apparatus 1, a voltage with a rectangular waveform having no voltage change in one pulse is applied to the lower electrode 16. The LPF 20 prevents from inputting high frequency RF components from the RF power source 19 to the DC pulse power source 21.

(Operation of Substrate Processing Apparatus)

First, the wafer 15 is carried by a not-shown carrier mechanism into the etching chamber 11 which has been evacuated to reach a predetermined pressure. Next, the wafer 15 is held on the lower electrode 16 by the electrostatic chuck included in the lower electrode 16.

Next, the process gas necessary for processing the wafer 15 is introduced from the process gas introduction pipe 12. At this time, the process gas introduced into the etching chamber 11 is discharged at a predetermined rate from the exhaust port 17 by the pressure regulating valve and the exhaust pump which are not shown. As a result, the pressure in the etching chamber 11 is kept constant.

Next, the RF is applied to the lower electrode 16 from the RF power source 19 via the matching device 18. Further, the DC pulse power source 21 applies the pulse voltage shown in FIG. 2 to the lower electrode 16 by superimposing the pulse voltage on the RF.

Then, the wafer 15 held on the lower electrode 16 is subjected to the etching process while plasma density is controlled by the RF power from the RF power source 19 and energy of the ions entering the wafer 15 is controlled by the negative voltage from the DC pulse power source 21.

(Voltage Change of Wafer during Processing)

Figure 3:
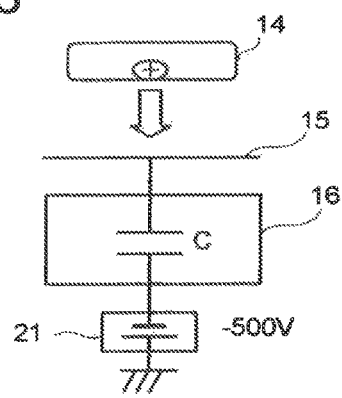
FIG. 3 is a view used to describe an increase in voltage of a wafer.
Figure 4:
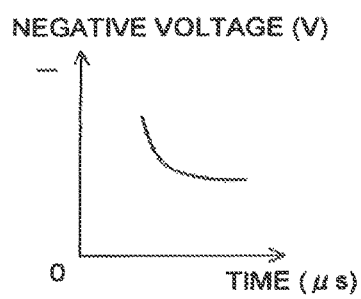
FIG. 4 is a chart showing a rough relation between the voltage of the wafer and time.

FIG. 3 is a view used to describe a voltage change of the wafer 15. The same constituent elements as those described in FIG. 1 are denoted by the same reference numerals and repeated description thereof will be omitted. FIG. 4 is a chart showing a rough relation between the voltage change of the wafer 15 and time. In FIG. 4, the vertical axis represents voltage (Voltage) and the horizontal axis represents time (μs). In FIG. 4, the voltage decreases as it goes upward in the vertical axis direction (the negative voltage decreases).

As shown in FIG. 3, the ions forming the plasma 14 are positively charged. The ions enter the wafer 15 on the lower electrode 16 to which the negative voltage is applied.

As previously described, the recent trend is toward a larger diameter of the wafer 15 and a higher density of the plasma 14, which leads to an increase in the number of ions entering the wafer 15 per unit time. The ions cancel the negative voltage which is applied to the wafer 15 via the lower electrode 16 to cause the increase in the voltage of the wafer 15 with time as shown in FIG. 4.

Figure 5:
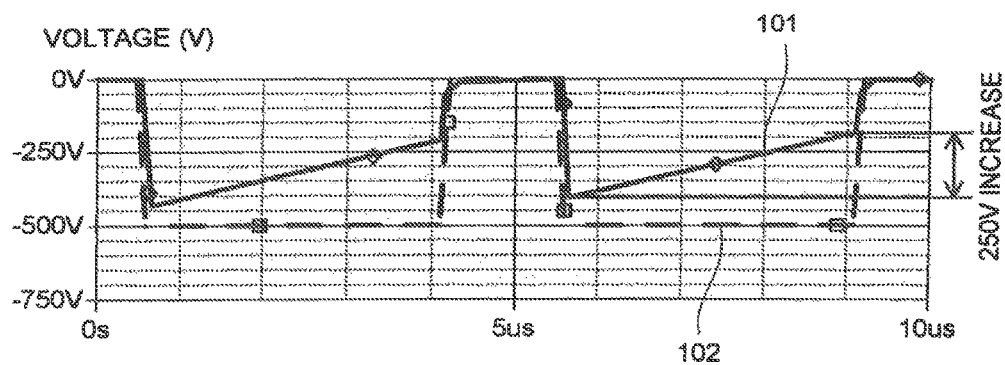
FIG. 5 is a chart showing an example of a simulation result.

FIG. 5 is a chart showing a simulation result of the voltage changes of the wafer 15 and the lower electrode 16 when the voltage with the waveform shown in FIG. 2 is applied. In FIG. 5, the vertical axis represents voltage (Voltage) and the horizontal axis represents time (μs).

The voltage changes can be simulated as follows. By using a plasma simulator (G. Chen, L. L. Raja, J. Appl. Phys. 96, 6073 (2004)), plasma density, electron temperature, cathode sheath capacitance, and anode capacitance are calculated. The plasma 14 according to the plasma density and so on is modeled by using a resistor and two sheaths constructed by a capacitor, a current source, and a diode. By applying the model to a circuit simulator (SPICE), the voltage change of the negative voltage at the wafer 15 can be analyzed.

Calculation conditions are shown below.

wafer diameter: 300 mm
distance between the upper electrode 13 and the lower electrode 16: 50 mm
capacitance of the electrostatic chuck of the lower electrode 16: 10 nF
frequency of the negative voltage pulse: 200 kHz
pressure in the etching chamber 11: 40 mTorr (about 5.3 Pa)
RF frequency/power: 100 MHz/1000 W The calculation results are shown below.

plasma density: $1 \times 10^{17}/m^3$
electron temperature: 3.0 eV
cathode sheath capacitance: 280 pF
anode capacitance: 14 nF A solid line 101 is a voltage in the wafer 15. A broken line 102 is the voltage applied to the lower electrode 16 via the LPF 20. As described with reference to FIG. 3 and FIG. 4, the positively charged ions enter the wafer 15 from the plasma 14. Therefore, when the voltage having a waveform shown by the broken line 102 in which voltage in one pulse is constant is applied to the lower electrode 16, the voltage of the wafer 15 increases with time as shown by the solid line 101 and finally the voltage increases by about 250 volts (Voltages) in one pulse.

As described above, in the conventional substrate processing apparatus 1 which applies the RF and the pulse negative voltage in a superimposed manner to the lower electrode 16, the voltage of the wafer 15 changes, resulting in a large variation of incident energy of the ions which enter the wafer 15 while the wafer 15 is processed. Further, the large variation of the incident energy of the ions deteriorates processing precision of the wafer 15.

Here, the voltage change of the wafer 15 in one pulse is given by the following expressions (1), (2).

$$V(t)=V_{pulse}(t)+\{Z \cdot e \cdot S \cdot B \cdot N_0 \cdot (k \cdot Te/m_i)^{1/2}/C\} \cdot t_{pulse} \quad \text{Expression (1)}$$

$$t_{pulse}=\text{Duty}/\omega_{pulse} \quad \text{Expression (2)}$$

V(t) is a time-dependent change of the voltage of the wafer 15. $V_{pulse}(t)$ is a time-dependent change of the voltage applied from the pulse power source 21. S is an area of the lower electrode 16. B is a Bohm coefficient. N0 is a density of the plasma 14 (electron density). k is a Boltzmann constant. Te is electron temperature. $m_i$ is a mass of the ions forming the plasma 14. e is an electron elementary quantum. Z is an ionic valency. C is a synthetic capacitance of the electrostatic chuck included in the lower electrode 16 and an electric circuit including the electrostatic chuck. $t_{pulse}$ is a applied time of the DC pulse in one period. Duty is an application duty ratio of the pulse. $\omega_{pulse}$ is a pulse frequency.

It is understood from the expression (1) that the following measures (1) to (3) are effective for reducing the voltage increase in the wafer 15.
(1) To decrease a value of $V_{pulse}$ in accordance with a lapse of time
(2) To increase the synthetic capacitance C of the electrostatic chuck and the electric circuit including the electrostatic chuck
(3) To increase the frequency of the pulse or to lower the duty ratio (to shorten the time duration of one pulse)

Here, it is technically difficult to fabricate a radio-frequency pulse power source, and it is conceivable that a process characteristic may change. Therefore, if the measure (3) is adopted, lowering the duty ratio is realistic.

Further, since a width of a process window at the time of microscopic processing of a low-K material is very narrow, it is preferable to reduce the voltage change of the wafer 15 to 50 V or less. The reason will be described below.

Figure 6:
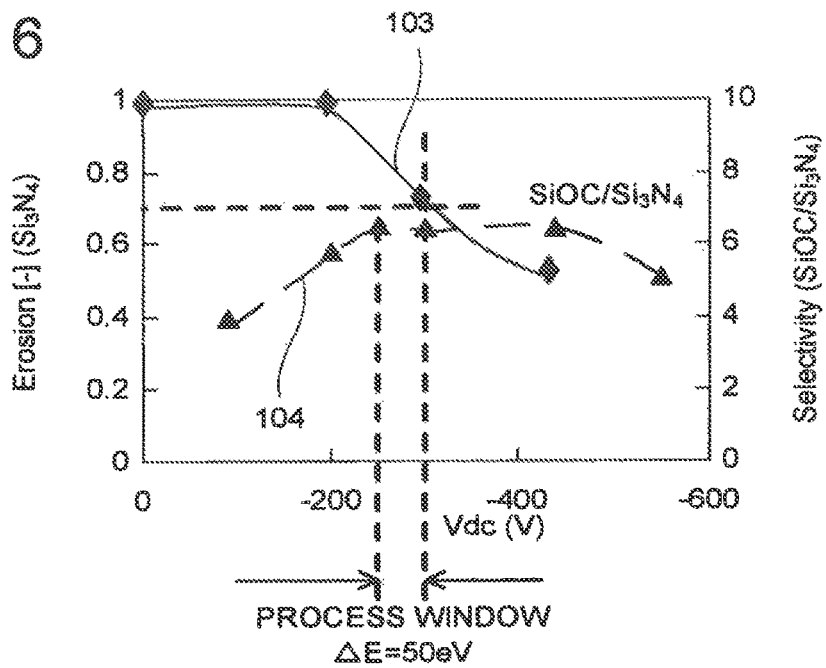
FIG. 6 is a relation of a chart showing selectivity of a SiOC film with respect to a silicon nitride film and erosion of the silicon nitride film.

FIG. 6 is a chart showing selectivity of a SiOC film (hereinafter, referred to as a low-K (low-permittivity) film) with respect to a $Si_3N_4$ film (hereinafter, referred to as a silicon nitride film) as a mask and erosion of the silicon nitride film, in relation to a bias voltage of the wafer 15 when the silicon nitride film and the low-permittivity film are subjected to the etching process.

The erosion refers to shoulder cutting of a pattern and is expressed by mask upper surface dimension after the etching/mask upper surface dimension before the etching. Generally, when this value is smaller than 0.7, an underlying layer is exposed. Therefore, when the wafer 15 is processed, it is necessary to achieve the erosion of 0.7 or more.

A solid line 103 in FIG. 6 shows the erosion of the silicon nitride film. A broken line 104 shows the selectivity of the silicon nitride film and the low-K film. Further, the left vertical axis represents the erosion of the silicon nitride film, the right vertical axis represents the selectivity of the silicon nitride film and the low-K film, and the horizontal axis represents the bias voltage.

As shown by the solid line 103, almost no erosion of the silicon nitride film occurs when the bias voltage is up to −200 V, but its value abruptly drops when the bias voltage becomes −200 V or less. Then, when the bias voltage becomes −300 V, the value of the erosion reaches an allowable limit 0.7 or less.

Further, as shown by the broken line 104, the selectivity of the silicon nitride film and the low-K film takes a substantially constant value when the bias voltage is −400 V to −250 V, but when the bias voltage is higher than −250 V or lower than −400 V, the selectivity of the silicon nitride film and the low-K film becomes low.

As described above, in the etching process of the low-K film, the selectivity of the silicon nitride film and the low-K film is sufficiently high when the bias voltage is −250 V or lower, but when the bias voltage is −300 V or lower, the erosion reaches the allowable limit 0.7 or less. Therefore, it is preferable to control the change in the bias voltage to about 50 V or lower as described above.

Hereinafter, embodiments for effectively reducing the voltage change of the wafer 15 will be described.

First Embodiment

Figure 7:
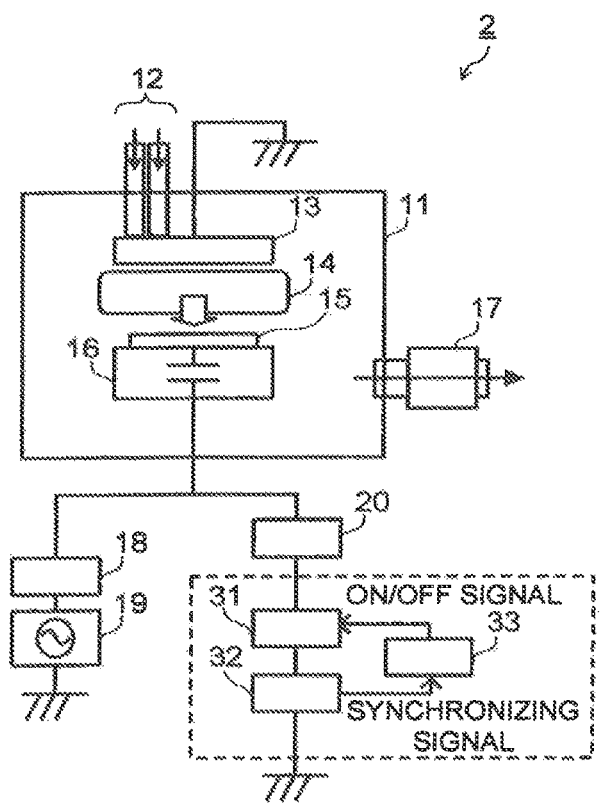
FIG. 7 is a schematic block diagram of a substrate processing apparatus according to a first embodiment.
Figure 8:
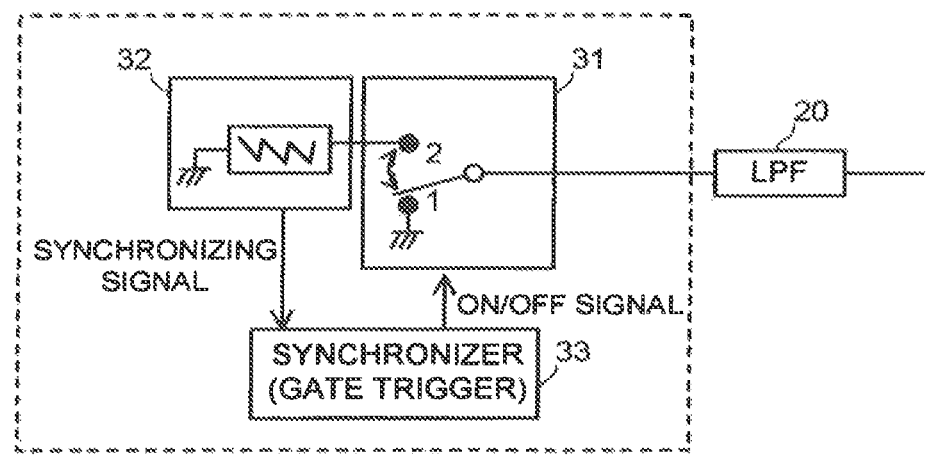
FIG. 8 is a detailed block diagram of a pulse applying unit according to the first embodiment.
Figure 9:
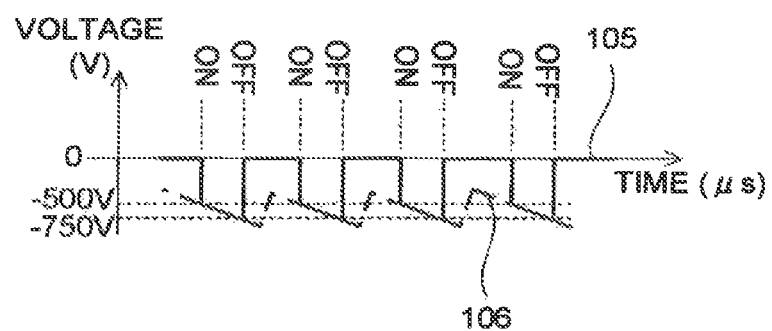
FIG. 9 is a schematic waveform chart of a voltage applied in a superimposed manner to a lower electrode.

FIG. 7 is a schematic block diagram of a substrate processing apparatus 2 according to one embodiment of the present invention. FIG. 8 is a detailed block diagram of a pulse applying unit. FIG. 9 is a schematic waveform chart of a voltage applied in a superimposed manner to a lower electrode 16. In FIG. 9, the vertical axis represents voltage (Voltage) and the horizontal axis represents time (μs).

A sawtooth power source 32 outputs to a switching circuit (first switching unit) 31 a sawtooth voltage shown by a wavy line 106 in FIG. 9. Further, the sawtooth power source 32 inputs a synchronizing signal to a gate trigger 33. The synchronizing signal is input to the gate trigger 33 every arbitrary point of the sawtooth waveform shown by the wavy line 106 in FIG. 9, for example, every lowest voltage point or every highest voltage point of the sawtooth waveform.

According to the synchronizing signal input from the sawtooth power source 32, the gate trigger 33 inputs a signal for ON/OFF switching to the switching circuit 31. Concretely, upon receiving the synchronizing signal from the sawtooth power source 32, the gate trigger 33 inputs an ON signal and an OFF signal at a predetermined time interval.

According to the signal input from the gate trigger 33, the switching circuit (first switching unit) 31 turns ON/OFF the input of the voltage, which is input from the sawtooth power source 32, to a LPF 20. Concretely, upon receiving the ON signal from the gate trigger 33, the switching circuit 31 connects a switch to the sawtooth power source 32 to input the voltage to the LPF 20. Upon receiving the OFF signal from the gate trigger 33, it disconnects the switch to the sawtooth power source 32 to shut off the input of the voltage to the LPF 20 and grounds the switch.

As a result, a voltage with a waveform shown by a solid line 105 in FIG. 9 is input to the LPF 20.

Further, a RF power source 19 applies RF with 40 MHz or higher to the lower electrode 16 via a matching device 18. The other constituent elements have been described with reference to FIG. 1, and therefore the common constituent elements will be denoted by the same reference numerals and repeated description thereof will be omitted. The switching circuit 31, the sawtooth power source 32, and the gate trigger 33 constitute a pulse voltage applying unit.

Figure 10:
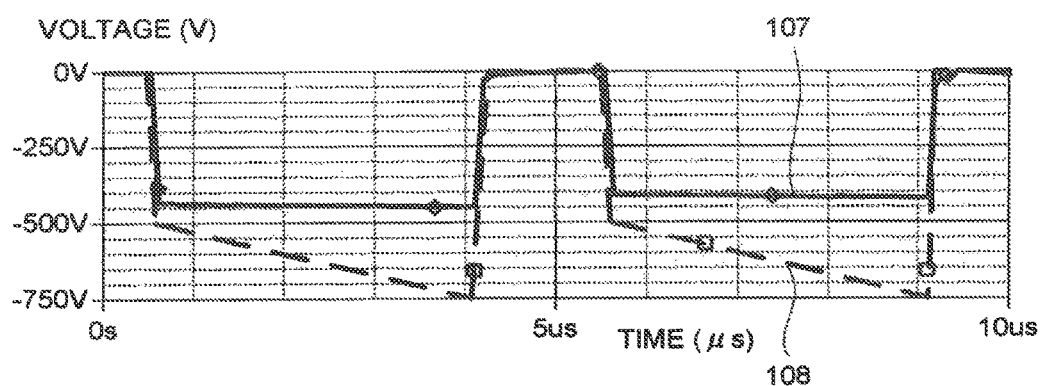
FIG. 10 is a chart showing an example of a simulation result.

FIG. 10 is a chart showing a simulation result of a voltage change of a wafer 15 when the voltage with the waveform shown by the solid line 105 in FIG. 9 is applied to the lower electrode 16. In FIG. 10, the vertical axis represents voltage (Voltage) and the horizontal axis represents time (μs). Simulation conditions and method are the same as the conditions and method described with reference to FIG. 5.

A solid line 107 is a voltage in the wafer 15. A broken line 108 is the voltage applied to the lower electrode 16 via the LPF 20. In order to cancel a voltage increase of the wafer 15 caused by the incidence of ions from plasma 14, the broken line 108 input to the lower electrode 16 is the voltage that has a waveform in which the voltage decreases by about 250 volts (Voltages) in one pulse.

As described above, the substrate processing apparatus 2 according to the first embodiment includes: the sawtooth power source 32 outputting the sawtooth voltage; the gate trigger 33 inputting the signal for the ON/OFF switching to the switching circuit 31 according to the synchronizing signal input from the sawtooth power source 32; and the switching circuit 31 ON/OFF-switching the voltage input from the sawtooth power source 32 according to the signal from the gate trigger 33. The pulse voltage whose voltage in one pulse decreases in accordance with time (negative voltage increases) as shown by the solid line 105 in FIG. 9 is applied to the lower electrode 16.

Therefore, it is possible to effectively reduce the voltage change of the wafer 15 held on the lower electrode 16 and to reduce the voltage change in the wafer 15 to 50 V or less. Further, since the voltage change of the lower electrode 16 during the processing of the wafer 15 can be reduced, it is possible to reduce the variation of incident energy of the ions entering the wafer 15. Further, owing to the reduction in the variation of the incident energy of the ions entering the wafer 15, favorable processing precision of the wafer 15 is obtained.

Modification Examples of First Embodiment

Figure 11:
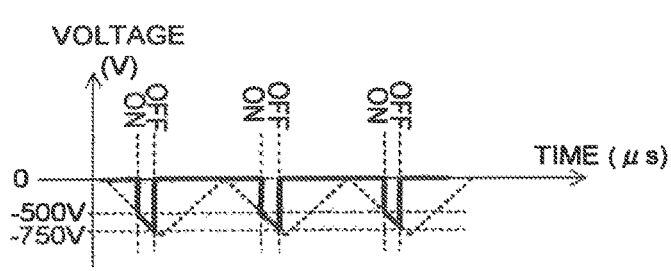
FIG. 11 is a waveform chart of a voltage applied to the lower electrode in a modification example of the first embodiment.
Figure 12:
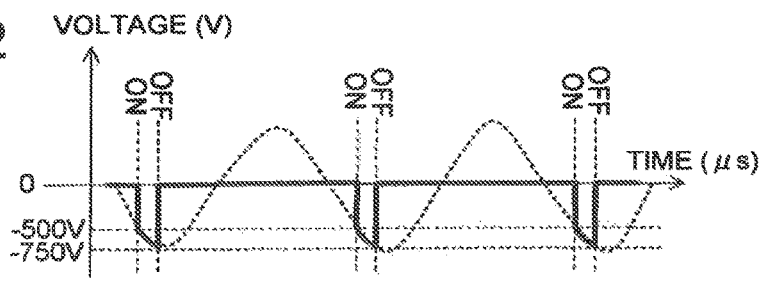
FIG. 12 is a waveform chart of a voltage applied to the lower electrode in a modification example of the first embodiment.

FIG. 11 and FIG. 12 are waveform charts of a voltage applied to the lower electrode 16 in modification examples of the first embodiment. In the first embodiment, the sawtooth voltage output from the sawtooth power source 32 as described with reference to FIG. 9 is taken out by the switching circuit 31, whereby the pulse voltage whose voltage in one pulse decreases in accordance with time is applied to the lower electrode 16.

However, the use of the sawtooth voltage is not necessarily essential provided that the voltage change of the wafer 15 in the course of the etching process can be reduced to 50 V or less. Therefore, a triangular wave shown by a broken line in FIG. 11 or a sin wave shown by a broken line in FIG. 12 may be taken out by the switching circuit, whereby a pulse voltage whose voltage in one pulse decreases in accordance with time as shown by a solid line in FIG. 11 or FIG. 12 may be applied to the lower electrode 16. Further, the time duration of one pulse may be shortened as described by the expression (1), which case is not shown. This case can also provide the same effects as those of the first embodiment.

Alternatively, the synchronization can be taken in the following manner. That is, signals are input from the gate trigger 33 to the sawtooth power source 32 and the switching circuit (first switching unit) 31 at a synchronous timing.

Second Embodiment

Figure 13:
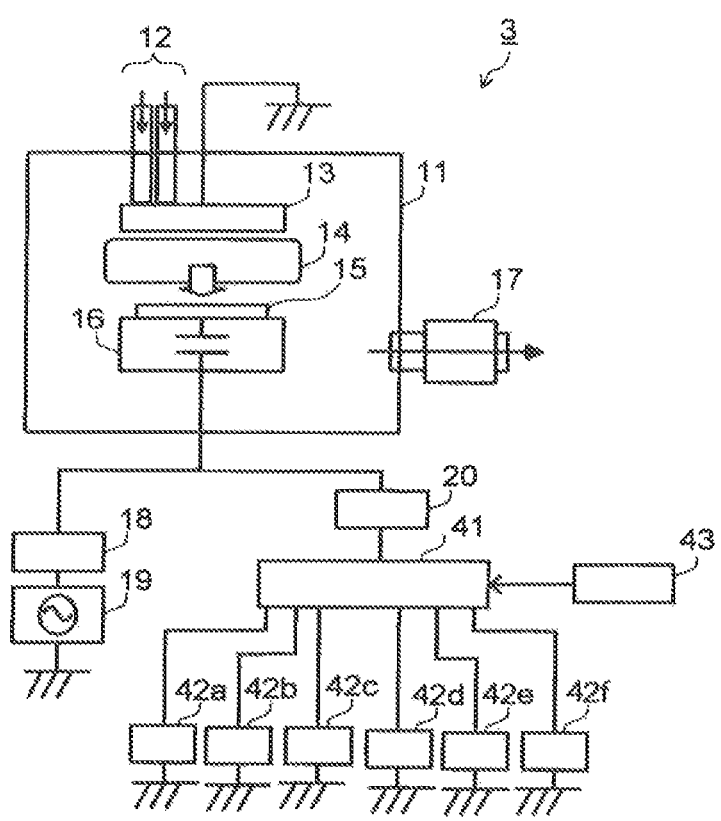
FIG. 13 is a schematic block diagram of a substrate processing apparatus according to a second embodiment.
Figure 14:
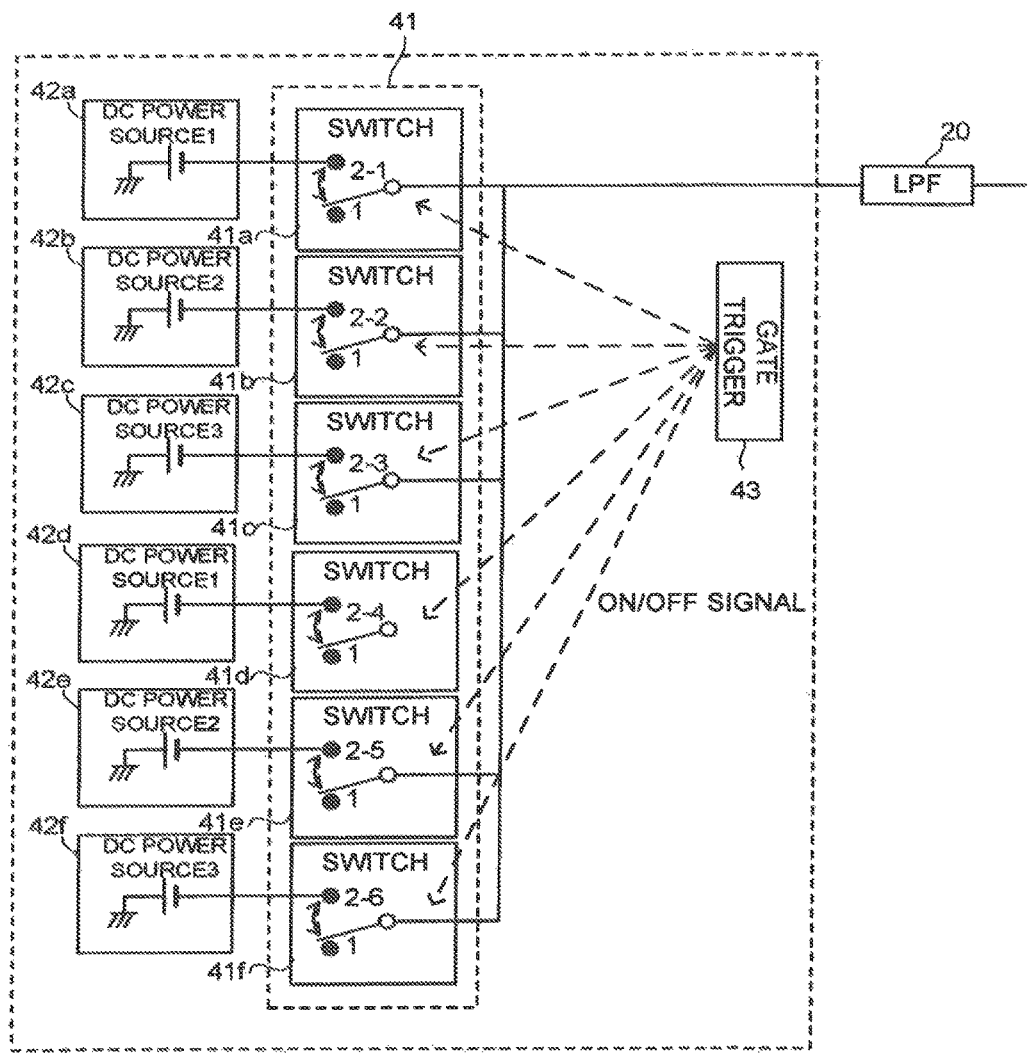
FIG. 14 is a detailed block diagram of a pulse applying unit.
Figure 15:
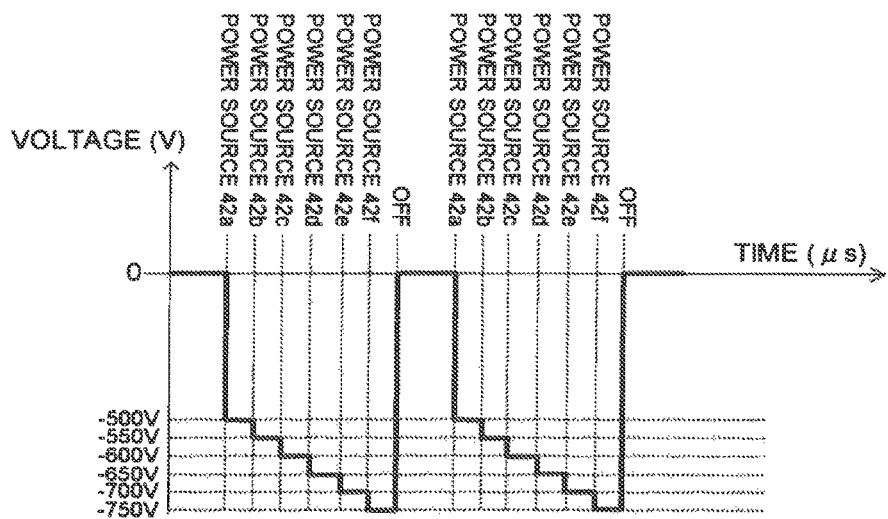
FIG. 15 is a schematic waveform chart of a voltage applied in a superimposed manner to a lower electrode.

FIG. 13 is a schematic block diagram of a substrate processing apparatus 3 according to a second embodiment. FIG. 14 is a detailed block diagram of a pulse applying unit. FIG. 15 is a schematic waveform chart of a voltage applied in a superimposed manner to a lower electrode 16. In FIG. 15, the vertical axis represents voltage (Voltage) and the horizontal axis represents time (μs).

DC power sources 42a to 42f input negative voltages different from one another to a switching circuit 41. A gate trigger 43 inputs to the switching circuit 41 a signal for switching among the DC power sources 42a to 42f. The switching circuit (second switching unit) 41 includes switches 41a to 41f corresponding to the DC power sources 42a to 42f respectively.

Each of the switches 41a to 41f turns ON or OFF according to the signal input from the gate trigger 43. Concretely, when an ON signal is received from the gate trigger 43, each of the switches 41a to 41f is connected so that the voltage is input to a LPF 20. Further, when an OFF signal is received from the gate trigger 43, each of the switches 41a to 41f is disconnected so that the input of the voltage to the LPF 20 is shut off. The switches 41a to 41f are controlled individually.

The other constituent elements have been described with reference to FIG. 1, and therefore the common constituent elements will be denoted by the same reference numerals and repeated description thereof will be omitted. Incidentally, the switching circuit 41, the DC power sources 42a to 42f, and the gate trigger 43 constitute a pulse voltage applying unit.

In the second embodiment, a voltage waveform shown by a solid line in FIG. 15 is obtained by the following control. It is assumed that a voltage increase in one pulse is 250 V and the time duration of one pulse is 36 μs.

The DC power source 42a outputs −500 V. The DC power source 42b outputs −550 V. The DV power source 42c outputs −600 V. The DC power source 42d outputs −650 V. The DC power source 42e outputs −700 V. The DC power source 42f outputs −750 V.

The gate trigger 43 inputs the signal to the switching circuit 41 every 6 μs. According to the signal from the gate trigger 43, the switching circuit 41 switches among the voltages input from the DC power sources 42a to 42f to apply the voltage to the lower electrode 16 via the LPF 20.

Figure 16:
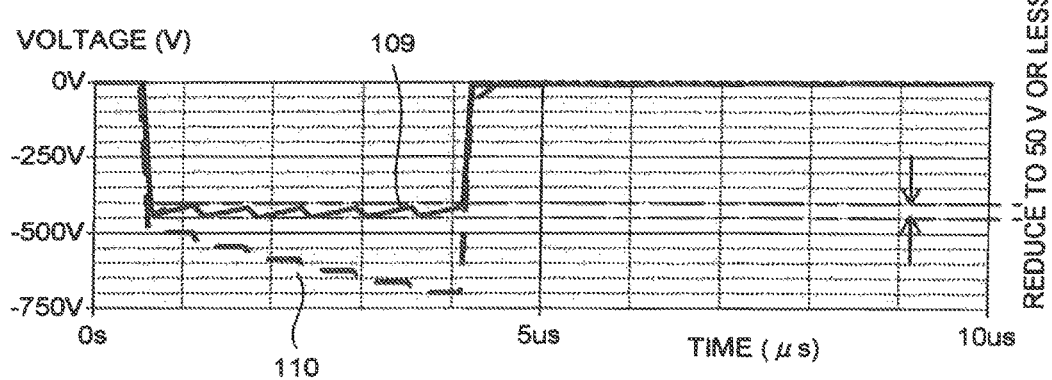
FIG. 16 is a chart showing an example of a simulation result.

FIG. 16 is a chart showing a simulation result of a voltage change of a wafer 15 when the voltage with the waveform shown in FIG. 15 is applied to the lower electrode 16. In FIG. 16, the vertical axis represents voltage (Voltage). Further, the horizontal axis represents time (μs). Simulation conditions and method are the same as the conditions and method described with reference to FIG. 5.

A solid line 109 is a waveform of the voltage in the wafer 15. A broken line 110 is a waveform of the voltage applied to the lower electrode 16. The gate trigger 43 and the switching circuit 41 switch among the negative voltages output from the DC power sources 42a to 42f at a predetermined time interval. Therefore, the voltage applied to the lower electrode 16 changes stepwise to −500 V, −550 V, −600 V, −650 V, −700 V, and −750 as shown by the broken line 110.

As a result, the voltage change of the wafer 15 in one pulse can be reduced to about 50 V as shown by the solid line 109. It should be noted that the number of the DC power sources is not limited to six and may be changed.

As described above, the substrate processing apparatus 3 according to the second embodiment includes: the plural DC power sources 42a to 42f outputting the negative voltages different from one another; and the switching circuit 41 selecting the voltage among the voltages output from the plural DC power sources to apply the selected voltage to the lower electrode 16. Then, the voltage with the waveform in which the voltage decreases stepwise in one pulse is applied to the lower electrode 16.

Therefore, it is possible to effectively reduce the voltage change of the wafer 15 held on the lower electrode 16 and to reduce the voltage change in the wafer 15 to 50 V or less. The other effects are the same as those of the first embodiment.

Another alternative structure may be such that an input accepting unit accepting a user's input is further included and the output voltages of the DC power sources 42a to 42f and the timing at which the gate trigger 43 switches among the DC power sources 42a to 42f can be set on a recipe, for instance.

Third Embodiment

Figure 17:
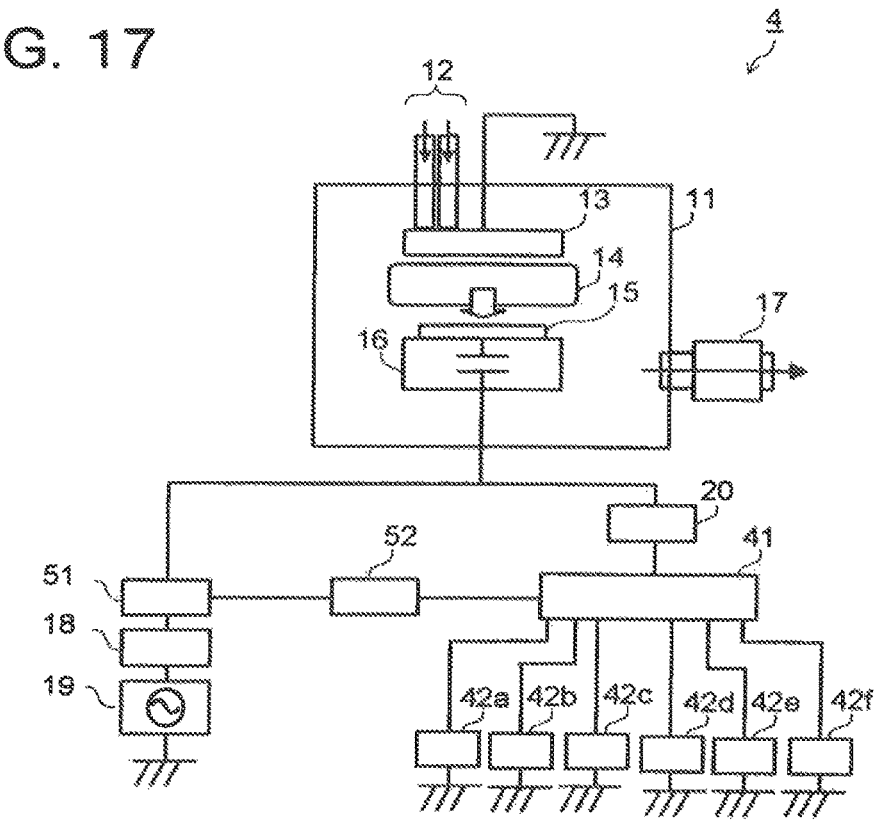
FIG. 17 is a schematic block diagram of a substrate processing apparatus according to a third embodiment.

FIG. 17 is a schematic block diagram of a substrate processing apparatus 4 according to a third embodiment. A voltage monitor (voltage measuring unit) 51 measures a voltage of a lower electrode 16 to input the measured voltage to a switching instruction circuit 52. The switching instruction circuit 52 instructs a switching circuit 41 to switch among DC power sources 42a to 42f, according to the voltage of the lower electrode 16 input from the voltage monitor 51.

Concretely, in order to reduce a voltage change of a wafer 15 on the lower electrode 16 to 50 V or less, the switching instruction circuit 52 inputs to the switching circuit 41 a signal instructing ON/OFF of the switches 41a to 41f included in the switching circuit 41, every time the voltage input from the voltage monitor 41 increases.

According to the instruction from the switching instruction circuit 52, the switching circuit 41 turns ON or OFF the switches 41a to 41f. Accordingly, the voltage applied to the lower electrode 16 changes stepwise to −500 V, −550 V, −600 V, 650 V, −700 V, and −750 V.

The other constituent elements have been described with reference to FIG. 1 and FIG. 13, and therefore the common constituent elements will be denoted by the same reference numerals and symbols and repeated description thereof will be omitted.

As described above, the substrate processing apparatus 4 according to the third embodiment includes: the voltage monitor 51 measuring the voltage of the lower electrode 16; and the switching instruction circuit 52 instructing the switching circuit 41 to switch among the DC power sources 42a to 42f according to the voltage of the lower electrode 16 measured by the voltage monitor 51.

Therefore, it is possible to effectively reduce the voltage change of the wafer 15 held on the lower electrode 16 and to reduce the voltage change in the wafer 15 to 50 V or less. The other effects are the same as those of the first embodiment.

Incidentally, instead of the voltage monitor 51, a plasma monitor (a plasma measuring unit such as a Langmuir probe) measuring electron density of plasma 14 may be included. The structure in which the switching instruction is given to the switching circuit 41 according to the electron density or the electron temperature of the plasma 14 measured by the plasma monitor also makes it possible to provide the same effects. For example, by setting the DC power source switching timing by the switching circuit 41 earlier to quicken the voltage increase when the plasma has a high electron density, it is possible to reduce the voltage change in the wafer 15 to 50 V or less.

Another alternative structure may be that an input accepting unit accepting a user's input is further included and output voltages of the DC power sources 42a to 42f can be set according to the voltage of the lower electrode 16 measured by the voltage monitor 51 or the electron temperature or the electron density measured by the plasma monitor, as in the second embodiment. Further, the number of the DC power sources is not limited to six and may be changed.

Modification Example of Third Embodiment

Figure 18:
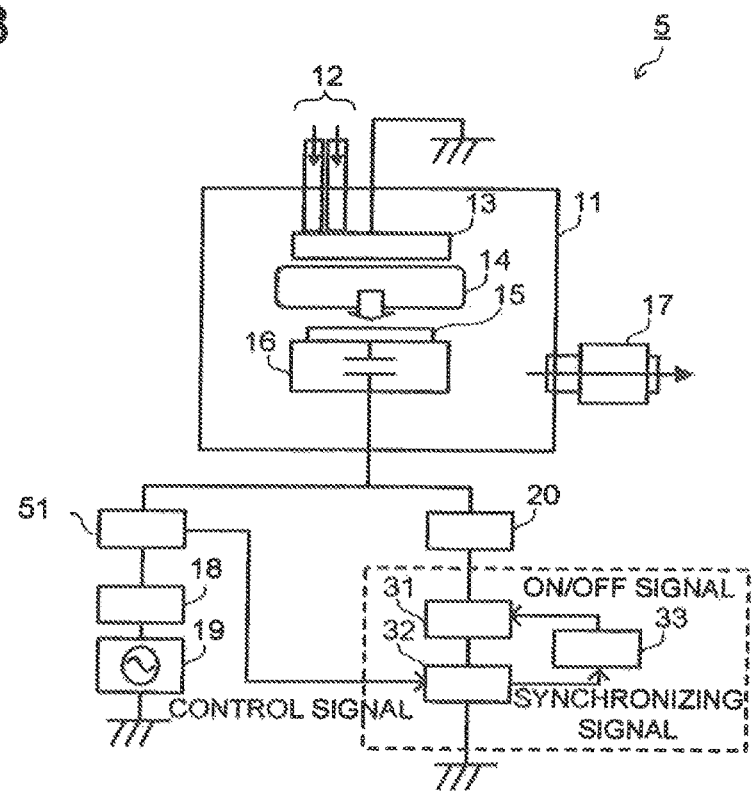
FIG. 18 is a schematic block diagram of a substrate processing apparatus according to a modification example of the third embodiment.

FIG. 18 is a schematic block diagram of a substrate processing apparatus 5 according to a modification example of the third embodiment. In the modification example of the third embodiment, a gradient of variation of a voltage of a sawtooth power source 32 is changed according to the voltage of the lower electrode 16 measured by the voltage monitor 51 or the electron temperature or the electron density measured by the plasma monitor, whereby the voltage change in the wafer 15 is reduced to small.

For example, when a voltage increase of the lower electrode 16 is large, or when the electron density or the electron temperature of the plasma 14 is high, the gradient of the variation of the voltage of the sawtooth power source 32 is made sharp, so that the voltage change in the wafer 15 can be reduced to 50 V or less. The other constituent elements have been described with reference to FIG. 1, and therefore the common constituent elements will be denoted by the same reference numerals and repeated description thereof will be omitted.

Fourth Embodiment

Figure 19:
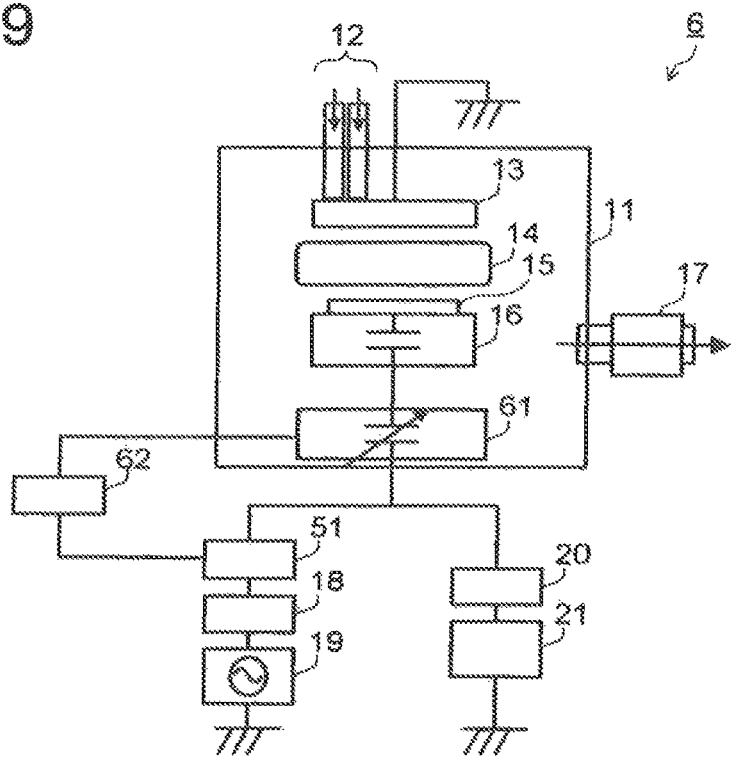
FIG. 19 is a schematic block diagram of a substrate processing apparatus according to a fourth embodiment.

FIG. 19 is a schematic block diagram of a substrate processing apparatus 6 according to a fourth embodiment. A variable capacitor 61 is a capacitor whose capacitance is variable. The variable capacitor 61 is connected in series to a lower electrode 16 including an electrostatic chuck. A control circuit 62 changes the capacitance of the variable capacitor 61 according to a voltage of the lower electrode 16 input from a voltage monitor 51. Concretely, the initial capacitance of the electrostatic chuck is set large, and a synthetic capacitance C is set small at a predetermined value by using the variable capacitor 61. When the voltage input from the voltage monitor 51 increases, the control circuit 62 increases the capacitance of the variable capacitor 61 in accordance with the increase in the voltage, thereby increasing the synthetic capacitance C of the variable capacitor 61 and the electrostatic chuck.

The other constituent elements have been described with reference to FIG. 1, and therefore the common constituent elements will be denoted by the same reference numerals and repeated description thereof will be omitted.

Figure 20:
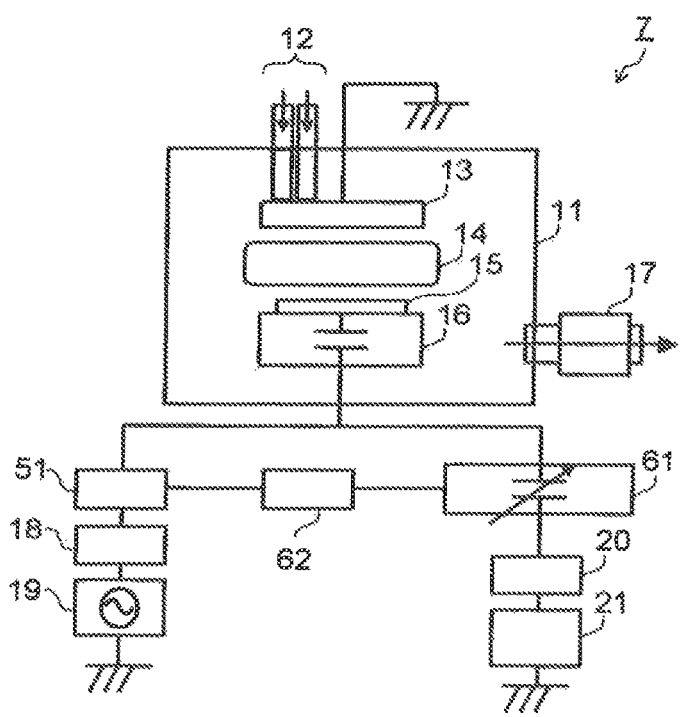
FIG. 20 is a schematic block diagram of a substrate processing apparatus according to a modification example of the fourth embodiment.

The position of the variable capacitor 61 may be a serial position to the lower electrode 16 or may be a serial position in a circuit for superimposed RF. Alternatively, the position may be a serial position in a circuit for superimposed DC pulse. For example, as in a substrate processing apparatus 7 shown in FIG. 20, the variable capacitor 61 is preferable to be arranged in series on a prior stage or a subsequent stage of the LPF 20, or in series in the LPF 20 or in the pulse power source 21, where the voltage monitor 51 can indirectly measure the voltage in the wafer 15 by measuring the voltage on a subsequent stage of the variable capacitor 61, because the voltage of the lower electrode 16 becomes close to the voltage in the wafer 15. By increasing the capacitance of the variable capacitor 61, the synthetic capacitance C of the variable capacitor 61 and the electrostatic chuck is increased, which makes it possible to reduce a voltage change in a wafer 15 to low.

As described above the substrate processing apparatus 6 according to the fourth embodiment includes: the voltage monitor 51 measuring the voltage of the lower electrode 16; and the control circuit 62 increasing the capacitance of the variable capacitor 61 according to the voltage of the lower electrode 16 measured by the voltage monitor 51 to increase the synthetic capacitance.

Therefore, it is possible to effectively reduce the voltage change of the wafer 15 held on the lower electrode 16 and to reduce the voltage change in the wafer 15 to 50 V or less.

The other effects are the same as those of the first embodiment.

Further, when the voltage change of the wafer 15 is too large only with the constituent elements included in the first to third embodiments, increasing the synthetic capacitor capacitance C makes it possible to reduce the voltage change in the wafer 15 to 50 V or less.

Fifth Embodiment

Figure 21:
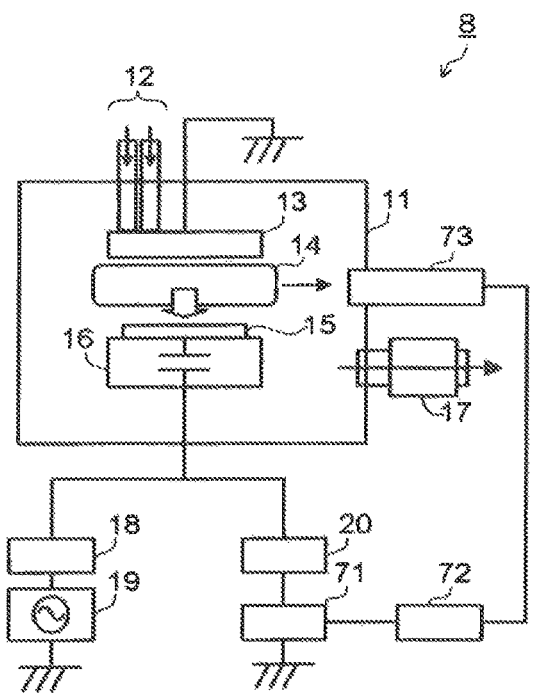
FIG. 21 is a schematic block diagram of a substrate processing apparatus according to a fifth embodiment.

FIG. 21 is a schematic block diagram of a substrate processing apparatus 8 according to a fifth embodiment. The substrate processing apparatus 8 includes a pulse voltage generating unit 71, a control unit 72, and a plasma monitor 73.

The pulse voltage generating unit 71 generates a pulse group voltage waveform.

Figure 22:
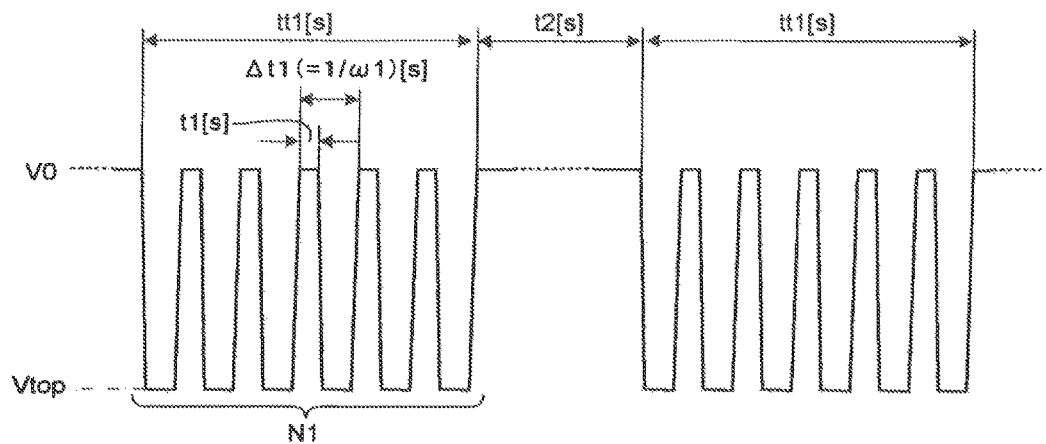
FIG. 22 is a schematic waveform chart of a voltage applied in a superimposed manner to a lower electrode.

FIG. 22 shows an example of the pulse group voltage waveform applied to a lower electrode 16 in a superimposed manner. In FIG. 22, the vertical axis represents voltage (Voltage) and the horizontal axis represents time (s). In the pulse group voltage waveform, a period tt1 including a plurality of pulsed waveforms (pulse group) and a period t2 not including the pulsed waveform (break time between the pulse groups) are repeated. In the period tt1, N1 pieces of the pulsed waveforms are repeated with a break time (break time between the pulses) t1 and a frequency ω1 (time interval Δt (=1/ω1) between the pulses).

In the pulsed waveform shown in FIG. 22, there are periods in which the voltage is kept at V0 (normally 0 V) and periods in which the voltage is kept at $V_{top}$. However, a certain degree of voltage variation is tolerated in these periods. That is, as the pulsed waveform, it is permitted to use a pseudo pulse (for example, a sin wave) besides a pure pulsed waveform.

The control unit 72 controls the pulse group voltage waveform. The control unit 72 controls at least one of the number N1 of the pulses, the frequency ω1, and the break times t1, t2.

Figure 23:
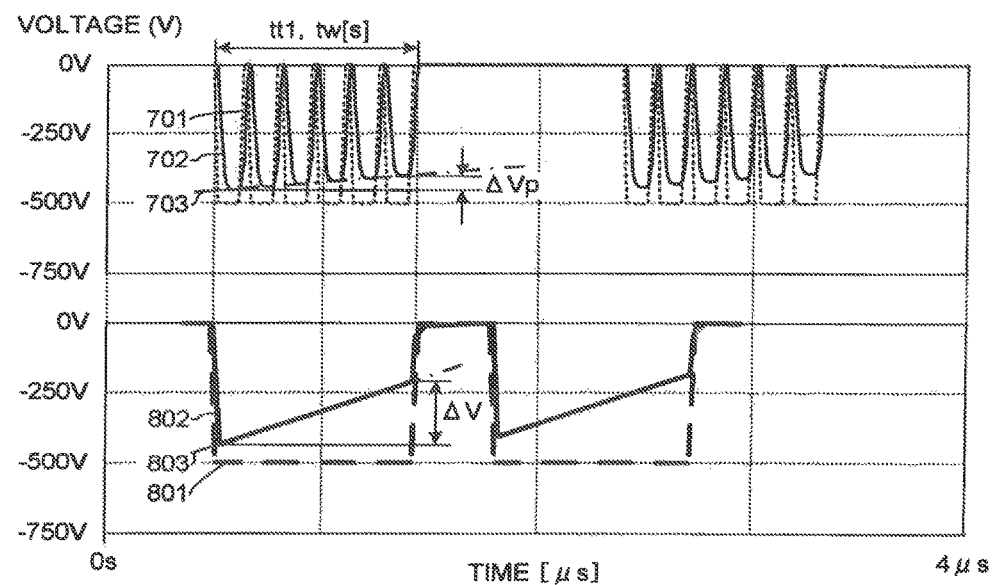
FIG. 23 is a chart showing an example of a simulation result.

FIG. 23 is a chart showing a simulation result of a voltage change of a wafer 15 when the pulse group voltage waveform shown in FIG. 22 is applied to the lower electrode 16. Here, the voltage change is shown in comparison with the voltage changes of the wafer 15 and the lower electrode 16 in FIG. 5 (in the case of the single pulse waveform shown in FIG. 2). In FIG. 23, the vertical axis represents voltage (Voltage) and the horizontal axis represents time (μs). Simulation conditions and method are the same as the conditions and method described with reference to FIG. 5.

Graphs 701 to 703 correspond to the pulse group voltage waveform. The graph 701 (broken line) is a voltage applied to the lower electrode 16 via a LPF 20 and corresponds to the pulse group voltage waveform shown in FIG. 22. The graph 702 (solid line) is a voltage in the wafer 15 at this time. In accordance with the application of the pulse voltage, the voltage in the wafer 15 varies, and the voltage has a peak corresponding to one pulse. The graph 703 shows a time-dependent variation (gradient) of a peak voltage Vp. In accordance with the time change, an absolute value of the peak voltage Vp decreases and a voltage drop ΔVp occurs in one pulse group.

Graphs 801 to 803 correspond to the single pulse voltage waveform. The graph 801 (broken line) is a voltage applied to the lower electrode 16 via the LPF 20 and corresponds to the single pulse voltage waveform shown in FIG. 2. The graph 802 (solid line) is a voltage in the wafer 15 at this time. The graph 803 shows a time-dependent variation (gradient) of the voltage. In accordance with the time change, an absolute value of the voltage decreases, and a voltage drop ΔV occurs in one pulse.

In FIG. 23, the period tt1 of the pulse group voltage waveform and a pulse width tw in the single pulse voltage waveform are set equal. At this time, the voltage drop ΔVp in the former is smaller than the voltage drop ΔV in the latter (ΔVp<ΔV). That is, it is understood that the voltage drop is less likely to occur in the pulse group voltage waveform than in the single pulse voltage waveform.

The use of the pulse group voltage waveform produces the following advantages (1) to (3).

(1) Adjusting the number N1 of the pulses makes it possible to control the change (voltage drop) ΔVp of the peak voltage Vp(t) in the wafer 15 to 50 V or less.

The change of the voltage V(t) in the pulse group voltage waveform is given by the following expression (3). Further, the change (voltage drop) ΔVp of the peak voltage Vp in one pulse group is given by the following expression (4).

$$V(t)=V_{pulse}(t)+\{Z\cdot e\cdot S\cdot B\cdot No\cdot (k\cdot Te/mi)^{1/2}/C\}\cdot t_{\mathit{eff}} \qquad \text{Expression (3)}$$

$$\Delta Vp=+\{Z\cdot e\cdot S\cdot B\cdot No\cdot (k\cdot Te/mi)^{1/2}/C\}\cdot t_{\mathit{eff}} \qquad \text{Expression (4)}$$

$$t_{\mathit{eff}}=((1/\omega 1)-t1)\cdot N1 \qquad \text{Expression (5)}$$

V(t) is the time-dependent change of the voltage of the wafer 15. $V_{pulse}$ is the time-dependent change of the voltage applied from the pulse voltage generating unit 71. S is an area of the lower electrode 16. B is a Bohm coefficient. No is a density of plasma 14 (electron density). k is a Boltzmann constant. Te is electron temperature. $m_i$ is a mass of ions forming the plasma 14. e is an electron elementary quantum. Z is an ionic valency. C is a synthetic capacitance of an electrostatic chuck included in the lower electrode 16 and an electric circuit including the electrostatic chuck. $t_{\mathit{eff}}$ is an effective time duration of the pulse application (time duration in which the pulse voltage is effectively applied in one pulse group). ω1 is a pulse frequency.

This expression (5) shows that the voltage drop ΔVp is controllable by the number N1 of the pulses. Incidentally, the voltage drop ΔV is controllable by the break time t1 and the frequency ω1 as well. The voltage drop ΔVp is determined by the plasma density No, the electron temperature Te, the capacitance C, a resistance R, the mass of ions mi, and the effective time duration $t_{\mathit{eff}}$ of the pulse application.

(2) Compared with the DC pulse waveform, the pulse group voltage waveform has a gentle gradient of the voltage drop.

As previously described, the voltage drop is less likely to occur in the pulse group voltage waveform than in the single pulse voltage waveform. This is because of a voltage restoration effect by an electron current in the break time t1. That is, in the break time t1, electric charge accumulated on the wafer 15 is released. This is also shown by the dependency of the effective pulse time duration $t_{\mathit{eff}}$ of the pulse application on the break time t1.

(3) The ions can be controlled not by individual pulses but by one pulse group.

As is shown by the following expression (6), the break time t1 is set shorter than a time constant (1/ωp) of the plasma ions. As a result, it is possible to prevent the individual pulses themselves from giving a great influence on the movement of the ions. That is, since the movement of the ions does not follow the voltage changes of the individual pulses, it seems from the ions as if one pulse group were one pulse.

$$t1 < 1/\omega p \text{[second]} \quad \text{Expression (6)}$$

$$\omega p (= e^2 N_0/\varepsilon_0 m i)^{1/2}:$$

plasma ion frequency
e: electron elementary quantum
$\varepsilon_0$: vacuum permittivity
mi: mass of ions
$N_0$: plasma density According to the expression (6), assuming that the plasma ion frequency ωp is, for example, 5 [MHz], the break time t1 is set to about 0.2 [μsec] or less. By such setting, it is possible to control the ions not by the individual pulses but by the entire one pulse group. In this case, due to an average value of the voltage in one pulse group (average application voltage), the ions substantially move to enter the wafer 15. That is, even with the use of the pulse group voltage waveform, it is possible to ensure uniformity of the incident energy of the ions.

Further, the dependency of the incident energy of the ions on the average application voltage means that a larger pulse voltage is necessary in order to increase the incident energy of the ions. However, if the pulse voltage is sufficiently high, it is possible to adjust the average application voltage (hence, the incident energy of the ions) even when the pulse voltage is set constant. That is, the incident energy of the ions can be adjusted by the number N1 of the pulses, the frequency ω1, and the break time t1.

The plasma monitor 73 measures the electron density or the electron temperature of the plasma 14, and is, for example, a Langmuir probe.

The control unit 72 is capable of controlling the pulse group voltage waveform according to the measurement result. For example, when the electron density of the plasma is high, by controlling the number N1 of the pulses, the frequency ω1 of the pulse, and the break time t1 so that the effective time duration $t_{eff}$ of the pulse application becomes short, it is possible to reduce the voltage change in the wafer 15.

Further, instead of using the plasma monitor 73, a voltage monitor may be used to measure the voltage of the lower electrode 16. The number N1 of the pulses, the frequency ω1 of the pulse, and the break time t1 are controlled so that the effective time duration $t_{eff}$ of the pulse application becomes short when the voltage change of the lower electrode 16 is large. As a result, it is possible to reduce the voltage change of the lower electrode 16.

The other constituent elements have been described with reference to FIG. 1, and therefore the common constituent elements will be denoted by the same reference numerals and repeated description thereof will be omitted.

Sixth Embodiment

Figure 24:
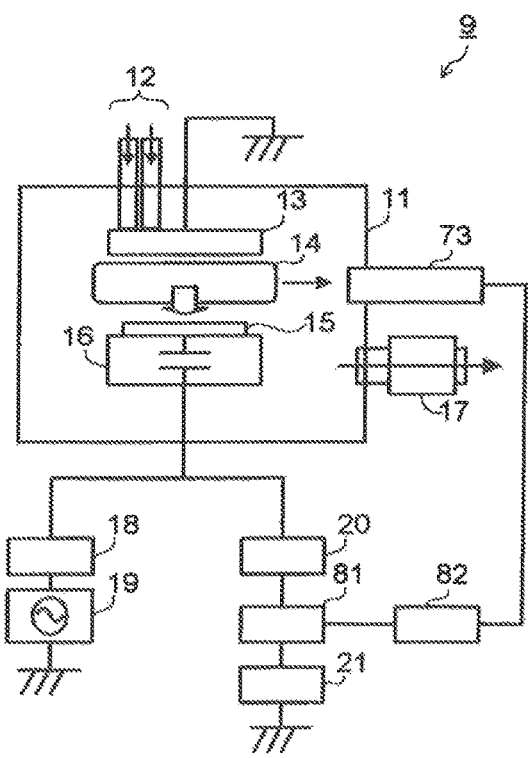
FIG. 24 is a schematic block diagram of a substrate processing apparatus according to a sixth embodiment.

FIG. 24 is a schematic block diagram of a substrate processing apparatus 9 according to a sixth embodiment.

The substrate processing apparatus 9 includes a variable resistor unit 81, a resistance control unit 82, a plasma monitor 73.

Figure 25:
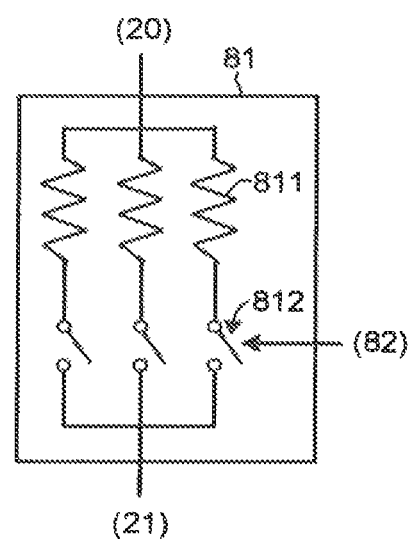
FIG. 25 is a detailed block diagram of a variable resistor unit.

As shown in FIG. 25, the variable resistor unit 81 has resistors 811 and switches 812 and is capable of varying a resistance value by ON/OFF of the switches 812. As each of the switches 812, usable is a bipolar transistor, a MOSFET (Metal-Oxide-Semiconductor Field-Effect Transistor), IGBT (Insulated Gate Bipolar Transistor), or the like. It suffices that the time constant of the switches 812 is about several tens MHz. Here, three sets of the resistor 811 and the switch 812 are shown. However, a larger number of sets (for example, 10 to 100 sets) of the resistor 811 and the switch 812 may be used. The use of a larger number of sets of the resistor 811 and the switch 812 enables more detailed variation of the resistance of the variable resistor unit 81.

The resistance control unit 82 operates the switches 812 to control the resistance value of the variable resistor unit 81.

Here, a voltage change V(t) of a wafer 15 in one pulse is given by the following expression (7). Further, a voltage change (voltage drop) ΔV in one pulse is given by the following expression (8).

$$V(t) = V_{const} + \{S \cdot B \cdot N_0 \cdot (k \cdot Te/mi)^{1/2}\} \cdot \{[\text{Duty}/(\omega_{pulse} \cdot C)]^2 + R^2\}^{1/2} \quad \text{Expression (7)}$$

$$\Delta V = +\{S \cdot B \cdot N_0 \cdot (k \cdot Te/mi)^{1/2}\} \cdot \{[\text{Duty}/(\omega_{pulse} \cdot C)]^2 + R^2\}^{1/2} \quad \text{Expression (8)}$$

V(t) is a time-dependent change of the voltage of the wafer 15. $V_{const}$ is a pulse voltage applied from a pulse power source 21. S is an area of a lower electrode 16. B is a Bohm coefficient. No is a density of plasma 14 (electron density). k is a Boltzmann constant. Te is electron temperature. $m_i$ is a mass of ions forming the plasma 14. C is a synthetic capacitance of an electrostatic chuck included in the lower electrode 16 and an electric circuit including the electrostatic chuck. Duty is an application duty ratio of the pulse. $\omega_{pulse}$ is a pulse frequency. R is a resistance in the variable resistor unit 81.

As shown in the expression (8), reducing the resistance R makes it possible to reduce the variation of the voltage V(t).

The plasma monitor 73 measures the electron density or the electron temperature of the plasma 14, and is, for example, a Langmuir probe.

The resistance control unit 82 is capable of controlling the resistance R according to the measurement result (the electron density or the electron temperature) measured by the plasma monitor 73. For example, by controlling the variable resistor unit 81 according to the electron density of the plasma so that the resistance R gets smaller, it is possible to reduce the voltage change in the wafer 15.

Further, instead of using the plasma monitor 73, a voltage monitor may be used to measure the voltage of the lower electrode 16. When the voltage change of the lower electrode 16 is large, the variable resistor unit 81 is controlled so that the resistance R gets smaller. As a result, the voltage change of the lower electrode 16 can be reduced.

The other constituent elements have been described with reference to FIG. 1, and therefore the common constituent elements will be denoted by the same reference numerals and repeated description thereof will be omitted.

Other Embodiment

It should be noted that the present invention is not limited to the above-described embodiments in its entirety, and when the embodiments are carried out, the constituent elements may be modified without departing from the spirit of the invention. For example, the present invention is applicable not only to the RIE but also to other substrate processing apparatuses such as a plasma CVD (Chemical Vapor deposition) apparatus and the like, for instance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus, comprising:
a chamber;
an inlet configured to introduce a gas for etching into the chamber;
a first electrode disposed in the chamber and having a main surface for placing a substrate thereon;
a second electrode disposed in the chamber and facing the first electrode;
a radio frequency (RF) power source configured to apply a RF voltage to the first electrode to generate ions of the gas, the RF voltage having a frequency of 40 MHz or higher; and
a voltage pulse generator configured to superimpose a voltage waveform on the RF voltage applied to the first electrode to lead the ions onto the substrate for its etching,
the voltage waveform having a first period and a second period alternately repeated,
the first period including N1 negative voltage pulses with a frequency of $\omega 1$ and break times t1 of 0.2 μsec or less between the voltage pulses,
the second period being a break time t2 lacking a voltage pulse, the break time t2 being longer than each break time t1, and
the voltage waveform having a voltage level of zero in the break times t1 and t2.

2. The apparatus according to claim 1, further comprising:
a voltage monitor configured to measure a voltage of the first electrode; and
a controller configured to control at least one of the number N1, the frequency $\omega 1$, and the break times t1, t2 in correspondence with the measured voltage.

3. The apparatus according to claim 1, further comprising:
a plasma monitor configured to measure an electron density of plasma; and
a controller configured to control at least one of the number N1, the frequency $\omega 1$, and the break times t1, t2 in correspondence with the measured electron density.

4. The apparatus according to claim 1, wherein the break time t1 is determined based on the expression t1<1/ωp [second], where $$\omega p = (e^2 N_0/(\varepsilon_0 mi))^{1/2}:$$

plasma ion frequency, where
e: electron elementary quantum,
$\varepsilon_0$: vacuum permittivity,
mi: mass of ions,
$N_0$: plasma density.

* * * * *